(12) United States Patent
Chen et al.

(10) Patent No.: US 8,890,626 B2
(45) Date of Patent: Nov. 18, 2014

(54) DIVIDER-LESS PHASE LOCKED LOOP (PLL)

(75) Inventors: Yen-Jen Chen, Taipei (TW); I-Ting Lee, Hsin-chu (TW); Hsieh-Hung Hsieh, Taipei (TW); Chewn-Pu Jou, Hsin-chu (TW); Fu-Lung Hsueh, Kaohsiung (TW); Shen-Iuan Liu, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 78 days.

(21) Appl. No.: 13/586,033

(22) Filed: Aug. 15, 2012

(65) Prior Publication Data

US 2014/0049329 A1    Feb. 20, 2014

(51) Int. Cl.
*H03K 3/03* (2006.01)

(52) U.S. Cl.
CPC .......... *H03K 3/0322* (2013.01); *H03K 3/0315* (2013.01)
USPC .................. 331/57; 331/16; 331/34; 331/17; 327/156; 327/159

(58) Field of Classification Search
CPC ......... H03L 7/085; H03L 7/0891; H03L 7/06; H03L 1/00; H03L 7/0995; H03K 3/0315; H03K 3/0322
USPC .................. 331/16, 34, 17, 57; 327/156, 159
See application file for complete search history.

(56) References Cited

U.S. PATENT DOCUMENTS

| | | | |
|---|---|---|---|
| 6,556,088 B1 * | 4/2003 | Dietl et al. | 331/17 |
| 8,031,027 B2 * | 10/2011 | Park et al. | 331/186 |
| 8,432,198 B2 * | 4/2013 | Liang et al. | 327/156 |
| 2010/0259305 A1 | 10/2010 | Lee et al. | |

OTHER PUBLICATIONS

Shahani, et al., "Low-Power Dividerless Frequency Synthesis Using Aperture Phase Detection", Dec. 1998, IEEE Journal of Solid-State Circuits, vol. 33, No. 12, pp. 2232-2239, http://www.ece.ucsb.edu/yuegroup/Publications/JSSC98_2.pdf.

* cited by examiner

*Primary Examiner* — Arnold Kinkead
(74) *Attorney, Agent, or Firm* — Cooper Legal Group, LLC

(57) ABSTRACT

One or more techniques and systems for a divider-less phase locked loop (PLL) and associated phase detector (PD) are provided herein. In some embodiments, a pulse phase detector (pulse$_{PD}$) signal, a voltage controlled oscillator positive differential (VCOP) signal, and a voltage controlled oscillator negative differential (VCON) signal are received. An up signal and a down signal for a first charge pump (CP) and an up signal and a down signal for a second CP are generated based on the pulse$_{PD}$ signal, the VCOP signal, and the VCON signal. For example, CP signals are generated to control the first CP and the second CP, respectively. In some embodiments, CP signals are generated such that the CPs facilitate adjustment of a zero crossing phase of the VCON and VCOP signals with respect to the pulse$_{PD}$ signal. In this manner, a divider-less PLL is provided, thus mitigating PLL power consumption.

20 Claims, 10 Drawing Sheets

DIVIDER-LESS PHASE LOCKED LOOP (PLL)

BACKGROUND

Generally, a phase locked loop (PLL) comprises a divider. For example, the divider is required to perform phase tracking such that a feedback frequency for a phase frequency detector (PFD) is equal to a reference frequency for the PFD. Additionally, the traditional PFD requires the feedback frequency to be the same as the reference frequency. Generally, the divider is associated with large power consumption, which is not desirable in most scenarios. In other PLLs, pulse injection associated with a voltage controlled oscillator (VCO) of the PLL is not desirable at least because pulse injection is not efficient.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

Among other things, one or more techniques and systems for a divider-less phase locked loop (PLL) and associated phase detector (PD) are provided herein. In some embodiments, a PD is provided and configured to receive a pulse phase detector (pulse$_{PD}$) signal, a voltage controlled oscillator positive differential (VCOP) signal, and a voltage controlled oscillator negative differential (VCON) signal. The pulse$_{PD}$ signal is associated with a reference frequency in some embodiments. Additionally, the VCOP or VCON signals are associated with an output frequency of a voltage controlled oscillator (VCO), where the output frequency is an integer multiple of the reference frequency. In some embodiments, at least one of an up signal for a first charge pump (CP), a down signal for the first CP, an up signal for a second CP, or a down signal for the second CP based on at least one of the pulse$_{PD}$ signal, the VCOP signal, or the VCON signal is generated to control the first CP or the second CP. In another embodiment, respective CP signals are generated to adjust a zero crossing phase of the VCON signal and the VCOP signal with respect to the pulse$_{PD}$ signal.

According to some embodiments, a phase locked loop (PLL) comprises a first portion comprising a divider and a second divider-less portion. For example, the PLL turns the divider of the first portion off or switches to the second divider-less portion in response to a PLL lock. Additionally, pulse injection for the second divider-less portion is initially disabled. In some embodiments pulse injection for the second divider-less portion is enabled in response to a zero crossing phase of the VCON signal and the VCOP signal at a position with respect to the pulse$_{PD}$ signal. For example, pulse injection for the second divider-less portion is enabled when the zero crossing is centered with respect to a pulse of the pulse$_{PD}$ signal. In this way, a divider-less PLL is provided, thus mitigating power consumption and a requirement for a feedback frequency to a phase frequency detector (PFD) to be the same as a reference frequency.

The following description and annexed drawings set forth certain illustrative aspects and implementations. These are indicative of but a few of the various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements or structures of the drawings are not necessarily be drawn to scale. Accordingly, the dimensions of the various features may be arbitrarily increased or reduced for clarity of discussion.

DETAILED DESCRIPTION

Figure 1:
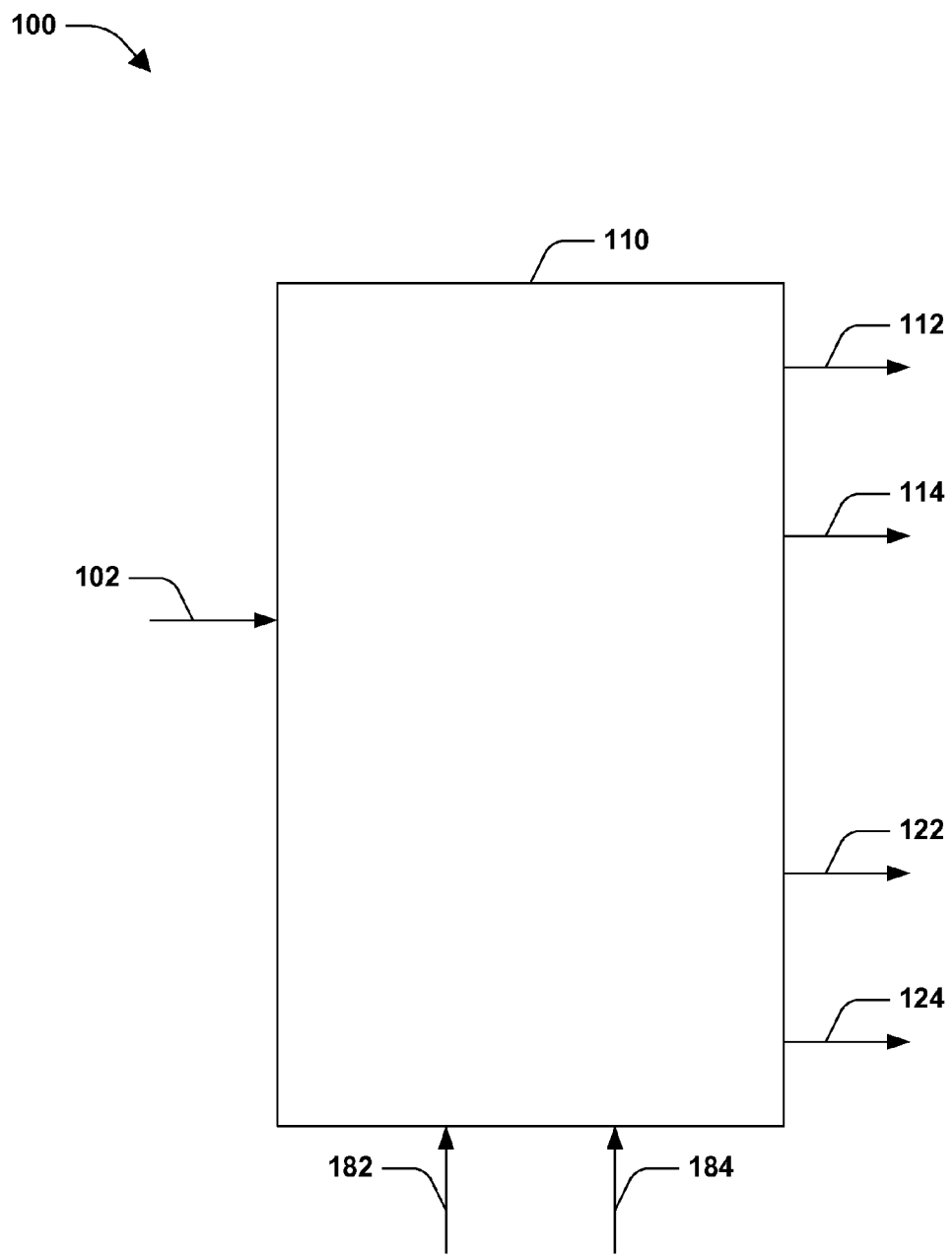
FIG. 1 is a schematic diagram of an example phase detector (PD) for a divider-less phase locked loop (PLL), according to some embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

Generally, a phase locked loop (PLL) comprises a phase frequency detector (PFD), a charge pump (CP), a loop filter, a voltage controlled oscillator (VCO), and a divider. However, the PFD requires that a feedback frequency fed back to the PFD be the same as a reference frequency input to the PFD. Additionally, the divider of the PLL is often associated with high power consumption, which is generally undesirable. Accordingly, one or more techniques and systems for a divider-less phase locked loop (PLL) and a phase detector (PD) for the divider-less PLL are provided herein. For example, the PD for the divider-less PLL mitigates the requirement that the feedback frequency be the same as the reference frequency by accepting or receiving inputs comprising different frequencies. For example, in some embodiments, the PD accepts or receives a reference frequency of 100 MHz and an output feedback frequency of the VCO of 1

GHz. Additionally, the divider-less PLL does not comprise a divider, thus mitigating power consumption of the divider-less PLL circuit.

In some embodiments, phase detection within a divider-less phase locked loop (PLL) comprises receiving a pulse phase detector (pulse$_{PD}$) signal associated with a reference frequency. Additionally, the phase detection comprises receiving a voltage controlled oscillator positive differential (VCOP) signal and a voltage controlled oscillator negative differential (VCON) signal, at least one of the VCOP signal or the VCON signal associated with an output frequency of a voltage controlled oscillator (VCO), the output frequency of the VCO comprising an integer multiple of the reference frequency. In some embodiments, phase detection comprises generating at least one of an up signal for a first charge pump (CP), a down signal for the first CP, an up signal for a second CP, or a down signal for the second CP based on at least one of the pulse$_{PD}$ signal, the VCOP signal, or the VCON signal, at least one of the up signal for the first CP, the down signal for the first CP, the up signal for the second CP, or the down signal for the second CP configured to facilitate control of at least one of the first CP or the second CP.

In some embodiments, a divider-less phase locked loop (PLL) comprises a pulse generator configured to generate at least one of a pulse injection signal or a pulse$_{PD}$ signal based on a reference frequency. Additionally, the divider-less PLL comprises a phase detector (PD) configured to generate at least one of a first up signal, a first down signal, a second up signal, or a second down signal based on at least one of the pulse$_{PD}$ signal, a voltage controlled oscillator positive differential (VCOP) signal, or a voltage controlled oscillator negative differential (VCON) signal. According to some aspects, the divider-less PLL comprises a first charge pump (CP) and a second CP, the first CP configured to generate a first portion of an output CP signal based on at least one of the first up signal or the first down signal, the second CP configured to generate a second portion of the output CP signal based on at least one of the second up signal or the second down signal. According to some aspects, at least one of the output CP signal, the first portion of the output CP signal, or the second portion of the output CP signal comprise a voltage indicative of a phase difference between the pulse$_{PD}$ signal and at least one of the VCOP signal or the VCON signal. In some examples, the divider-less PLL comprises a loop filter configured to filter the output CP signal. For example, the filtered signal is configured to drive a voltage controlled oscillator (VCO). In some embodiments, the VCO is configured to generate at least one of the VCOP signal or the VCON signal based on at least one of the filtered output CP signal or the pulse injection signal. In some embodiments, the VCOP signal and the VCON signal are fed back to the PD to form a feedback loop for the divider-less PLL.

FIG. 1 is a schematic diagram 100 of an example phase detector (PD) for a divider-less phase locked loop (PLL), according to some embodiments. In some embodiments, 110 is a phase detector (PD) for a divider-less phase locked loop (PLL) configured to receive a pulse phase detector (pulse$_{PD}$) signal 102 associated with a reference frequency, a voltage controlled oscillator positive differential (VCOP) signal 182, and/or a voltage controlled oscillator negative differential (VCON) signal 184. In some embodiments, the PD 110 is configured to generate an up signal for a first charge pump (CP) 112, a down signal for the first CP 114, an up signal for a second CP 122, and a down signal for the second CP 124. In some examples, the VCOP signal 182 and the VCON signal 184 are differential signals of a differential pair associated with an output frequency of an output signal for a voltage controlled oscillator (VCO). For example, the output frequency of the output signal of the VCO is an integer multiple of the reference frequency of the pulse$_{PD}$ signal 102. According to some embodiments, the VCOP signal 182 and the VCON signal 184 are fed back from the VCO to form a feedback loop with the PD 110. In some embodiments, PD 110 is a circuit configured to sense two periodic inputs, such as the pulse$_{PD}$ signal 102 and the output frequency of the VCO associated with the VCOP signal 182 and the VCON signal 184. For example, the PD 110 is configured to produce or generate one or more output voltages, such as charge pump signals 112, 114, 122, and 124. In some embodiments, the up signal for the first CP 112 and the down signal for the first CP 114 are indicative of a phase difference between the rising edge of the pulse$_{PD}$ signal 102 and the rising edge of the VCOP feedback signal 182, which is inside the pulse$_{PD}$ signal 102. Similarly, the up signal for the second CP 122 and the down signal for the second CP 124 are indicative of a phase difference between the falling edge of the pulse$_{PD}$ signal 102 and the falling edge of the VCON feedback signal 184, which is inside the pulse$_{PD}$ signal 102. In some embodiments, the up signal for the first CP 112 is a first up signal, the down signal for the first CP 114 is a first down signal, the up signal for the second CP 122 is a second up signal, and the down signal for the second CP 124 is a second down signal. In some embodiments, the PD 110 is configured to control at least one of a net charge of the first CP, a net charge of the second CP, or a charge ratio between the first CP and the second CP. In some embodiments, the PD 110 is configured to adjust as phase of a zero crossing for the VCOP signal 182 and the VCON signal 184 relative to the pulse$_{PD}$ signal 102 by generating the charge pump signals 112, 114, 122, and 124 accordingly.

In some embodiments, the phase detector (PD) 110 is configured to be edge triggered. For example, the PD 110 is configured to generate a rising edge for the up signal for the first CP 112 based on a rising edge of the pulse$_{PD}$ signal 102. In some embodiments, the phase detector (PD) 110 is configured to generate a rising edge for the up signal for the second CP 122 based on a falling edge of the pulse$_{PD}$ signal 102. In some embodiments, the phase detector (PD) 110 is configured to generate a rising edge for the down signal for the first CP 114 based on a rising edge of the VCOP signal 182. In some embodiments, the phase detector (PD) 110 is configured to generate a rising edge for the down signal for the second CP 124 based on a falling edge of the VCON signal 184. In some embodiments, the phase detector (PD) 110 is configured to generate a falling edge for at least one of the up signal for the first CP 112 or the down signal for the first CP 114 based on a logic high up signal for the first CP 112 and a logic high down signal for the first CP 114. In some embodiments, the phase detector (PD) 110 is configured to generate a falling edge for at least one of the up signal for the second CP 122 or the down signal for the second CP 124 based on a logic high up signal for the second CP 122 and a logic high down signal for the second CP 124.

In some embodiments, PD 110 is configured to generate at least one of a first signal comprising a logical AND of the VCOP signal 182 and the pulse$_{PD}$ signal 102 or a second signal comprising a logical AND of the VCON signal 184 and the pulse$_{PD}$ signal 102. For example, the PD 110 is configured to control a pulse width for the first signal based on at least one of a delay or an OR gate.

Figure 2:
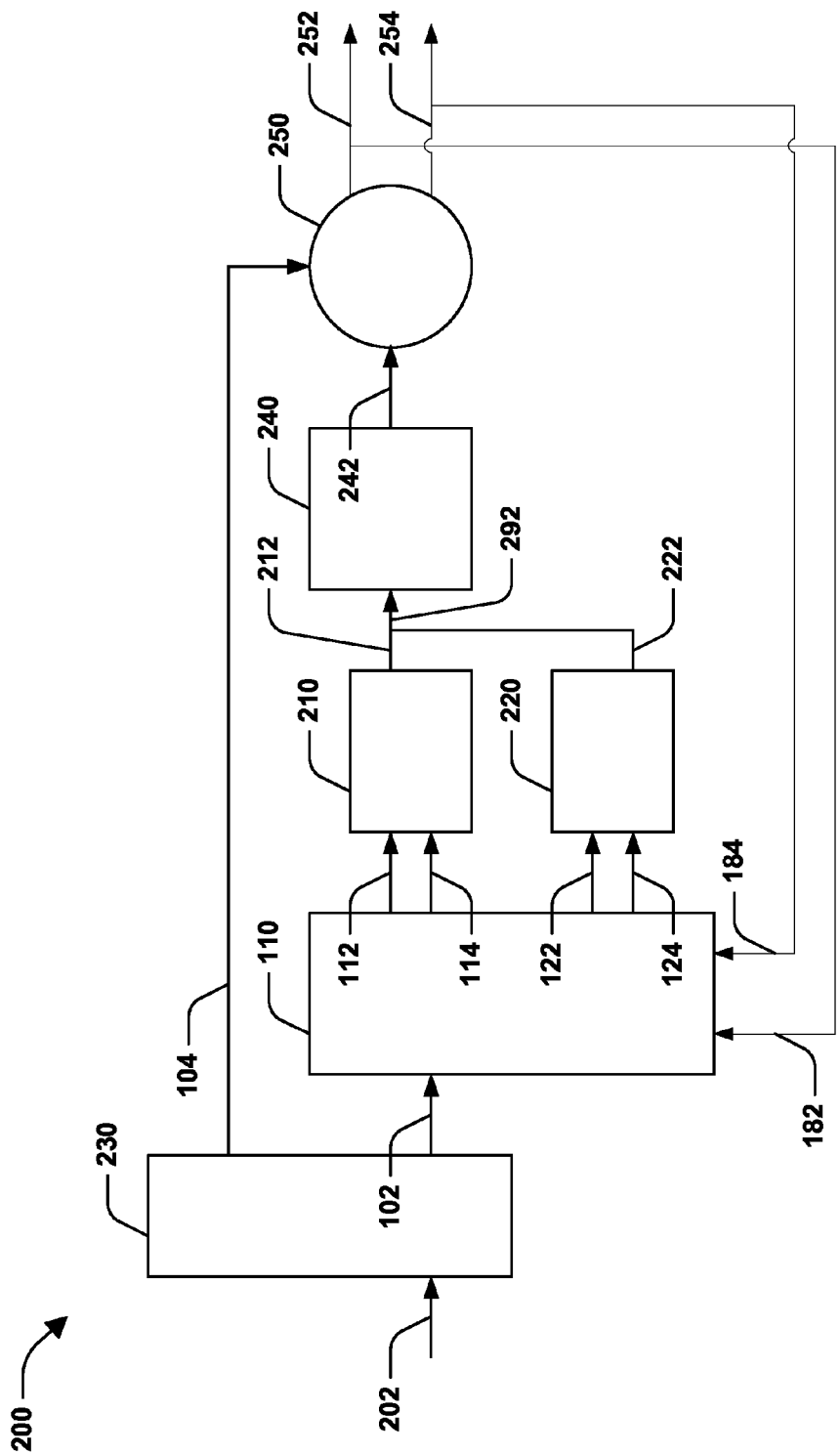
FIG. 2 is a schematic diagram of an example divider-less phase locked loop (PLL), according to some embodiments.

FIG. 2 is a schematic diagram 200 of an example divider-less phase locked loop (PLL), according to some embodiments. In some embodiments, a divider-less phase locked loop (PLL) comprises a pulse generator 230, a phase detector (PD) 110, a first charge pump (CP) 210, a second CP 220, a filter 240, and a voltage controlled oscillator 250. For example, the pulse generator 230 is configured to generate at least one of a pulse injection signal 104 or a pulse phase detector (pulse$_{PD}$) signal 102 based on a reference signal 202 comprising a reference frequency. In some embodiments, the pulse generator 230 is configured to generate the pulse injection signal 104 such that the pulse injection signal comprises a pulse smaller than a pulse of the pulse$_{PD}$ signal 102. In some embodiments, at least one of the pulse injection signal 104 or the pulse$_{PD}$ signal 102 is associated with the reference frequency of the reference signal 202.

In some embodiments, a divider-less PLL comprises a phase detector (PD) 110 configured to generate an up signal for a first charge pump (CP) 112, a down signal for the first CP 114, an up signal for a second CP 122, and a down signal for the second CP 124 based on the pulse$_{PD}$ signal 102, a voltage controlled oscillator positive differential (VCOP) signal 182, and a voltage controlled oscillator negative differential (VCON) signal 184. In some embodiments, the VCOP signal 182 and the VCON signal 184 are feedback signals fed back from outputs of a voltage controlled oscillator (VCO), such as 252 and 254, respectively. Accordingly, the VCOP signal 182 and the VCON signal 184 form a differential signal pair associated with an output frequency of an output of the VCO, in some embodiments. Therefore, the PD 110 is configured to accept a first frequency and a second frequency where the first frequency is different than the second frequency. For example, the first frequency is a frequency associated with the pulse$_{PD}$ signal 102, such as a reference frequency. For example, the second frequency is the output frequency associated with the output of the VCO, the VCOP signal 182, and the VCON signal 184. In some embodiments, the second frequency is an integer multiple of the first frequency. That is, for example, if the VCOP signal 182 and the VCON signal 184 are associated with an output frequency of 1 GHz, the reference frequency associated with the pulse$_{PD}$ signal 102 is 100 MHz, in some embodiments. In other words, a frequency associated with VCOP 182 and VCON 184 is equal to an integer multiplied by the reference frequency associated with the pulse$_{PD}$ signal 102. Therefore, since the PD 110 is configured to accept a first frequency different from a second frequency, there is no need for a divider in the PLL of FIG. 2.

In some embodiments, the PD 110 is configured to generate the charge pump signals 112, 114, 122, and 124 to facilitate control of a first CP 210 and a second CP 220. In other embodiments, the PD 110 is configured to generate respective charge pump signals 112, 114, 122, and 124 such that respective charge pump signals are configured to adjust a zero crossing phase of the VCON signal 184 and the VCOP signal 182 with respect to the pulse$_{PD}$ signal 102. For example, in some embodiments, a zero crossing of the VCON signal 184 and the VCOP signal 182 is substantially centered or in the middle with respect to a pulse of the pulse$_{PD}$ signal 102. In some embodiments, a zero crossing of the VCON signal 184 and the VCOP signal 182 is substantially centered with respect to a pulse of the pulse$_{PD}$ signal 102. In some examples, a phase difference between the pulse$_{PD}$ signal 102 and a zero crossing of the VCON signal 184 and the VCOP signal 182 is zero. However, it will be appreciated that in other embodiments, a PLL is configured to adjust a phase of at least one of the pulse$_{PD}$ signal 102, the VCOP signal 182, or the VCON signal 182 such that the zero crossing of the VCON signal 184 and the VCOP signal 182 is not centered with respect to the pulse$_{PD}$ signal 102. In some embodiments, the up signal for the first CP 112 and the down signal for the first CP 114 are indicative of a phase difference between the rising edge of the pulse$_{PD}$ signal 102 and the rising edge of the VCOP feedback signal 182, which is inside the pulse$_{PD}$ signal 102. Similarly, the up signal for the second CP 122 and the down signal for the second CP 124 are indicative of a phase difference between the falling edge of the pulse$_{PD}$ signal 102 and the falling edge of the VCON feedback signal 184, which is inside the pulse$_{PD}$ signal 102.

According to some aspects, a divider-less PLL comprises a first charge pump (CP) 210 and a second CP 220. In some embodiments, the first CP 210 is configured to generate a first portion of an output CP signal 212 based on at least one of the up signal for the first CP 112 and the down signal for the first CP 114. Accordingly, the first portion of the output CP signal 212 is indicative of a phase difference between the pulse$_{PD}$ signal 102 and the VCOP feedback signal 182. Similarly, the second CP 220 is configured to generate a second portion of the output CP signal 222 based on at least one of the up signal for the second CP 122 and the down signal for the second CP 124. Accordingly, the second portion of the output CP signal 222 is indicative of a phase difference between the pulse$_{PD}$ signal 102 and the VCON feedback signal. In some embodiments, the first portion of the output CP signal 212 and the second portion of the output CP signal 212 are connected together to form an output CP signal 292. It will be appreciated that in some embodiments, the up signal for the first CP 112 is a first up signal 112, the down signal for the first CP 114 is a first down signal 114, the up signal for the second CP 122 is a second up signal 122, and the down signal for the second CP 124 is a second down signal 124. In some embodiments the first CP 210 is configured to convert a phase difference between the pulse$_{PD}$ signal 102 and the VCOP feedback signal 182 into the first portion of the output CP signal 212. In some embodiments the second CP 220 is configured to convert a phase difference between the pulse$_{PD}$ signal 102 and the VCON feedback signal 184 into the second portion of the output CP signal 222. For example, the first portion of the output CP signal 212 and the second portion of the output CP signal 222 are generated based on the up signal for the first CP 112, the down signal for the first CP 114, the up signal for the second CP 122, and the down signal for the second CP 124, respectively. In an embodiment, an output CP signal 292 is generated based on the first portion of the output CP signal 212 and the second portion of the output CP signal 222. For example, the output CP signal 292 comprises the first portion of the output CP signal 212 and the second portion of the output CP signal 222. In some embodiments, the output CP signal 292 is indicative of at least one of a phase difference between the pulse$_{PD}$ signal 102 and the VCON feedback signal 184 or a phase difference between the pulse$_{PD}$ signal 102 and the VCOP feedback signal 182 and comprises a voltage corresponding to the phase difference.

In some embodiments, a net charge for the first CP 210 is determined based on the up signal for the first CP 112 and the down signal for the first CP 114. Similarly, a net charge for the second CP 220 is determined based on the up signal for the second CP 122 and the down signal for the second CP 124. In some examples, the net charge for the first CP 210 and the net charge for the second CP 220 are associated with an injection phase between the pulse injection signal 104, the VCOP signal 182, and the VCON signal 184. For example, when the net charge for the first CP 210 and the net charge for the second CP 220 are equal, a phase between a rising edge of the pulse injection signal 104 and a rising edge for the VCOP signal 182 which is inside the pulse injection signal 104 are the same. For another example, when the net charge for the first CP 210 and the net charge for the second CP 220 are equal, the phase between a falling edge of the pulse injection signal 104 and a falling edge for the VCON signal 184 which is inside the pulse injection signal 104 are the same. It will be appreciated that the phase between the rising edge of the pulse injection signal 104 and the rising edge for the VCOP signal 182 inside the pulse injection signal 104 is the same as the phase between the falling edge of the pulse injection signal 104 and the falling edge for the VCON signal 184 inside the pulse injection signal 104. In some embodiments, the VCOP signal 182 and the VCON signal 184 are fed back from output signals 252 and 254 of the voltage controlled oscillator (VCO) 250, respectively. Accordingly, it will be appreciated that different injection lock topologies are associated with different injection phases between the pulse injection signal 104, the VCOP signal 182, and the VCON signal 184. In some embodiments, an injection metal oxide semiconductor (MOS) transistor is connected between the VCON signal 184 and the VCOP signal 182. In some embodiments, the PD 110 is configured to control at least one of a net charge of the first CP 210, a net charge of the second CP 220, or a charge ratio between the first CP 210 and the second CP 220. Accordingly, this enables the PD 110 to control an injection phase of the PLL for a crossing, such as a zero crossing of the VCON signal 184 and the VCOP signal 182, with respect to the $pulse_{PD}$ signal 102. In this way, the PD 110 facilitates pulse injection for the VCO 250, as will be described in more detail in FIG. 5.

In some embodiments a filter 240 is configured to filter the output CP signal 292 and produce a filtered signal 242. In some examples, the output CP signal 292 and the filtered signal 242 are associated with a phase difference between the $pulse_{PD}$ signal 102 and at least one of the VCON signal 184 or the VCOP signal 182. In some embodiments the filter 240 is a low pass filter. According to some aspects, a voltage controlled oscillator (VCO) 250 is configured to generate VCO outputs 252 and 254 based on at least one of the pulse injection signal 104 or the filtered signal 242. In some embodiments, 252 is a voltage controlled oscillator positive differential (VCOP) signal and 254 is a voltage controlled oscillator negative differential (VCON) signal. Additionally, VCOP signal 252 and VCON signal 254 are fed back to the phase detector (PD) 110 via VCOP feedback signal 182 and VCON feedback signal 184, respectively. In some embodiments, this configuration is a negative feedback loop. Therefore, if a phase associated with at least one of the VCOP signal 182 or the VCON signal 184 changes, charge pump signals 112, 114, 122, and 124 will change accordingly, to drive the phase associated with at least one of the VCOP signal 182 or the VCON signal 184 in an opposite direction, for example. In this way, a feedback loop from the VCO 250 to the PD 110 facilitates phase locking for a phase of at least one of the VCOP signal 182 or the VCON signal 184 to a phase of the $pulse_{PD}$ signal 102, thereby locking the PLL.

Figure 3:
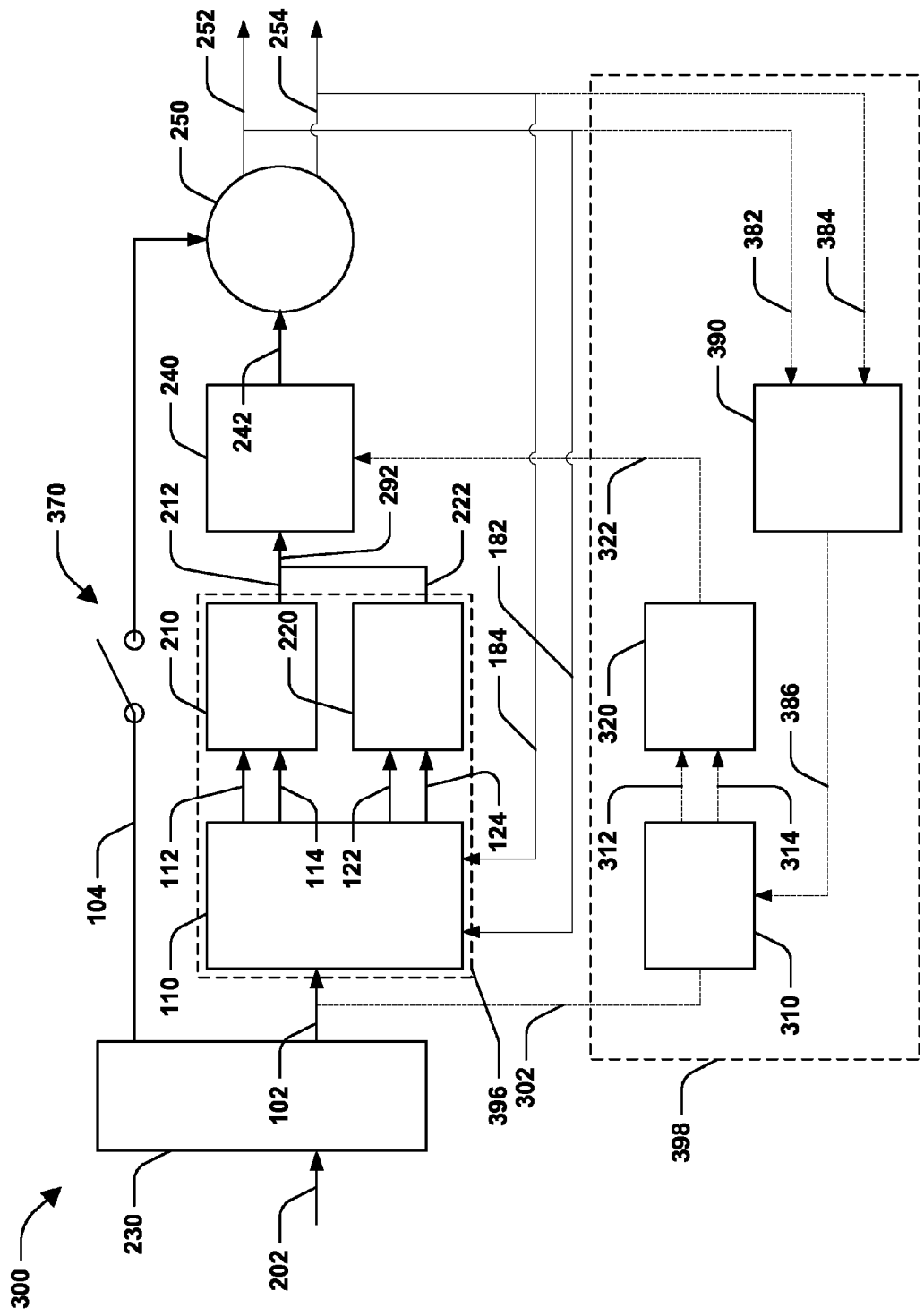
FIG. 3 is a schematic diagram of an example divider-less phase locked loop (PLL), according to some embodiments.

FIG. 3 is a schematic diagram 300 of an example divider-less phase locked loop (PLL), according to some embodiments. In an embodiment, the PLL of FIG. 3 comprises a first portion 398 comprising a divider 390 and a second divider-less portion 396. For example, the first portion 398 comprises the divider 390, a phase frequency detector (PFD) 310 and a charge pump 320. For example, the second divider-less portion 396 comprises a phase detector (PD) 110, a first charge pump 210, and a second charge pump 220. In some embodiments, the PLL of FIG. 3 utilizes architecture associated with the first portion 398 at a first time. At a second time, the first portion 398 comprising the divider 390 is turned off and the second divider-less portion 396 is turned on. That is, for example, the first portion 398 is disconnected from the PLL circuit and the second divider-less portion 396 is connected to the PLL circuit. In some examples, the second time is associated with a PLL lock. In other words, the divider 390 and the first portion 398 is disconnected from at least one of the VCON signal 254 or the VCOP signal 252 in response to a lock in the PLL. Therefore, the divider 390 is disabled, thus enabling a reduction is power consumption for the divider-less PLL.

In some embodiments, the PLL of FIG. 3 comprises a pulse generator 230, a phase frequency detector (PFD) 310, a charge pump (CP) 320, a filter 240, a voltage controlled oscillator (VCO) 250, and a divider 390 at the first time, such as before a PLL lock, for example. Therefore, at the first time, the pulse generator 230 is configured to generate at least one of the pulse injection signal 104 or the pulse phase detector ($pulse_{PD}$) signal 102 based on the reference signal 202, the reference signal 202 comprising a reference frequency, at least one of the pulse injection signal 104 or the $pulse_{PD}$ signal 102 associated with the reference frequency of the reference signal. Accordingly, the $pulse_{PD}$ signal 102 passes to $pulse_{PD}$ signal 302 for the PFD 310. Therefore, $pulse_{PD}$ signal 302 is associated with the reference frequency of the reference signal 202. In some embodiments, the PFD 310 receives a feedback signal 386 from divider 390 and is configured to compare feedback signal 386 and the $pulse_{PD}$ signal 302 and produce a first error signal 312 and a second error signal 314 associated with a phase difference between the feedback signal 386 and the $pulse_{PD}$ signal 302. In some embodiments, feedback signal 386 comprises a divided signal from divider 390. Charge pump 320 is configured to generate an output CP signal 322 based on the first error signal 312 and the second error signal 314. In some embodiments charge pump 320 is configured to convert the phase difference associated with the first error signal 312 and the second error signal 314 into the output CP signal 322. Filter 240 is configured to filter the output CP signal 322 to produce a filtered signal 242. In some embodiments, the VCO 250 is configured to generate VCO outputs 252 and 254 based on at least one of the pulse injection signal 104 or the filtered signal 242. In some embodiments, the VCO 250 comprises a voltage control node. Accordingly, the filtered signal 242 is connected to the voltage control node of the VCO 250 in some embodiments. For example, when a control voltage associated with the filtered signal 242 is increased, an output frequency associated with at least one of the VCOP signal 252 or the VCON signal 254 is increased or decreased accordingly. For example, when the control voltage associated with the filtered signal 242 is decreased, an output frequency associated with at least one of the VCOP signal 252 or the VCON signal 254 is decreased or increased accordingly. In this way, the VCO 250 compensates for a phase difference between the reference frequency associated with the $pulse_{PD}$ signal 302 and a frequency of the feedback signal 386. In some embodiments, 252 is a voltage controlled oscillator positive differential (VCOP) signal and 254 is a voltage controlled oscillator negative differential (VCON) signal. Additionally, VCOP signal 252 and VCON signal 254 are fed back to the divider 390 via VCOP feedback signal 382 and VCON feedback signal 384, respectively. In some embodiments, the divider 390 is configured to divide an output frequency associated with at least one of the VCOP feedback signal 382 and the VCON feedback signal 384, by an integer, for example. According to some embodiments the output frequency is divided by the integer such that feedback signal 386 comprises a same frequency as the reference frequency associated with the $pulse_{PD}$ signal 302.

In some embodiments, the PLL of FIG. 3 comprises the pulse generator 230, a phase detector (PD) 110, a first charge pump (CP) 210, a second CP 220, the filter 240, and the voltage controlled oscillator (VCO) 250 at the second time, such as after the PLL lock, for example. At the second time, the first portion 398 is disconnected from the PLL circuit and the second divider-less portion 396 is connected to the PLL. Accordingly, the pulse generator 230 is configured to generate at least one of the pulse injection signal 104 or the pulse phase detector (pulse$_{PD}$) signal 102 based on the reference signal 202, the reference signal 202 comprising a reference frequency, at least one of the pulse injection signal 104 or the pulse$_{PD}$ signal 102 associated with the reference frequency of the reference signal. Accordingly, the pulse$_{PD}$ signal 102 is received by the phase detector (PD) 110. In some embodiments, PD 110 is configured to receive a voltage controlled oscillator positive differential (VCOP) signal 182, and a voltage controlled oscillator negative differential (VCON) signal 184. In some embodiments, the pulse$_{PD}$ signal 102 comprises a different phase than the VCOP signal 182 and the VCON signal 184. Generally, the VCOP signal 182 and the VCON signal 184 comprise a same phase. According to some embodiments the VCOP signal 182 and the VCON signal 184 are fed back to the PD 110 from VCO 520 via outputs 252 and 254, respectively. In some embodiments, the PD 110 generates outputs configured to drive a first charge pump (CP) 210 and a second CP 220. For example, the PD 110 is configured to generate an up signal for the first CP 112, a down signal for the first CP 114, an up signal for a second CP 122, and a down signal for the second CP 124 based on the pulse$_{PD}$ signal 102, the VCOP signal 182, and the VCON signal 184. In some embodiments, respective charge pump signals 112, 114, 122, and 124 are indicative of a phase difference between the pulse$_{PD}$ signal 102 and at least one of the VCOP signal 182 and the VCON signal 184, respectively. Charge pump signals 112 and 114 drive the first CP 210 to convert a phase difference between the pulse$_{PD}$ signal 102 and the VCOP signal 182 into a first portion of an output CP signal 212. Similarly, charge pump signals 122 and 124 drive the second CP 220 to convert a phase difference between the pulse$_{PD}$ signal 102 and the VCON signal 184 into a second portion of the output CP signal 222. Output CP signal 292 is formed from the first portion of the output CP signal 212 and the second portion of the output CP signal 222 and comprises a voltage indicative of a phase difference between the pulse$_{PD}$ signal 102 and at least one of the VCOP signal 182 and the VCON signal 184. In some examples, filter 240 is configured to filter the output CP signal 292 to provide a filtered signal 242 associated with a phase difference between the pulse$_{PD}$ signal 102 and at least one of the VCOP signal 182 or the VCON signal 184. In some embodiments, the VCO 250 is configured to generate VCO outputs 252 and 254 based on at least one of the pulse injection signal 104 or the filtered signal 242. At the second time, switch 370 is open such that pulse injection is disabled, thus the VCO 250 is configured to generate VCO outputs 252 and 254 based on the filtered signal 242. In this way, the VCO 250 compensates for a phase difference between the reference frequency associated with the pulse$_{PD}$ signal 102 and a frequency of at least one of the feedback VCOP signal 182 or the feedback VCON signal 184. In some embodiments, the VCOP signal 252 and the VCON signal 254 are fed back to the PD 110 via VCOP feedback signal 182 and VCON feedback signal 184, respectively.

As mentioned, pulse injection for the second divider-less portion 396 is initially disabled or disconnected from the PLL of FIG. 3. In some embodiments, pulse injection for the second divider-less portion 396 is disabled at the second time. In some examples, pulse injection for the second divider-less portion 396 is enabled at a third time via switch 370 in some embodiments. Therefore, at the third time, pulse injection signal 104 is injected into the VCO 250. In some embodiments, the third time is associated with a zero crossing phase of the VCON feedback signal 184 and the VCOP feedback signal 182 at a position with respect to the pulse$_{PD}$ signal 102. For example, pulse injection is enabled in response to an adjustment to the zero crossing phase of the VCON feedback signal 184 and the VCOP feedback signal 182 such that the zero crossing is at a center of the pulse$_{PD}$ signal 102. In other words, switch 370 is closed at the third time, thus enabling the pulse injection signal 104 to be injected into the VCO 250 in response to an adjustment of a phase of at least one of the pulse$_{PD}$ signal 102, the VCON feedback signal 184, or the VCOP feedback signal 182. For example, the adjustment to the phase of the VCON feedback signal 184 or the VCOP feedback signal 182 is an adjustment to the zero crossing phase of the VCON signal 184 and the VCOP signal 182 at least because the zero crossing is associated with a point where the VCOP 182 and VCON signals 184 change from positive to negative or cross an X axis on a voltage versus time graph in some embodiments, for example. Additionally, the pulse generator 230 is configured to inject the pulse injection signal 104 into the VCO 250 based on a phase difference between the pulse$_{PD}$ signal 102 and a zero crossing of the VCON feedback signal 184 and the VCOP feedback signal 182. For example, in some embodiments, the phase difference between the pulse$_{PD}$ signal 102 and the zero crossing is zero, and a pulse of the pulse$_{PD}$ signal 102 is centered on the zero crossing. Therefore, the PLL of FIG. 3 operates identically to the PLL of FIG. 2 at the third time in some embodiments. In this way efficient injection locking or phase locking is provided.

Figure 4:
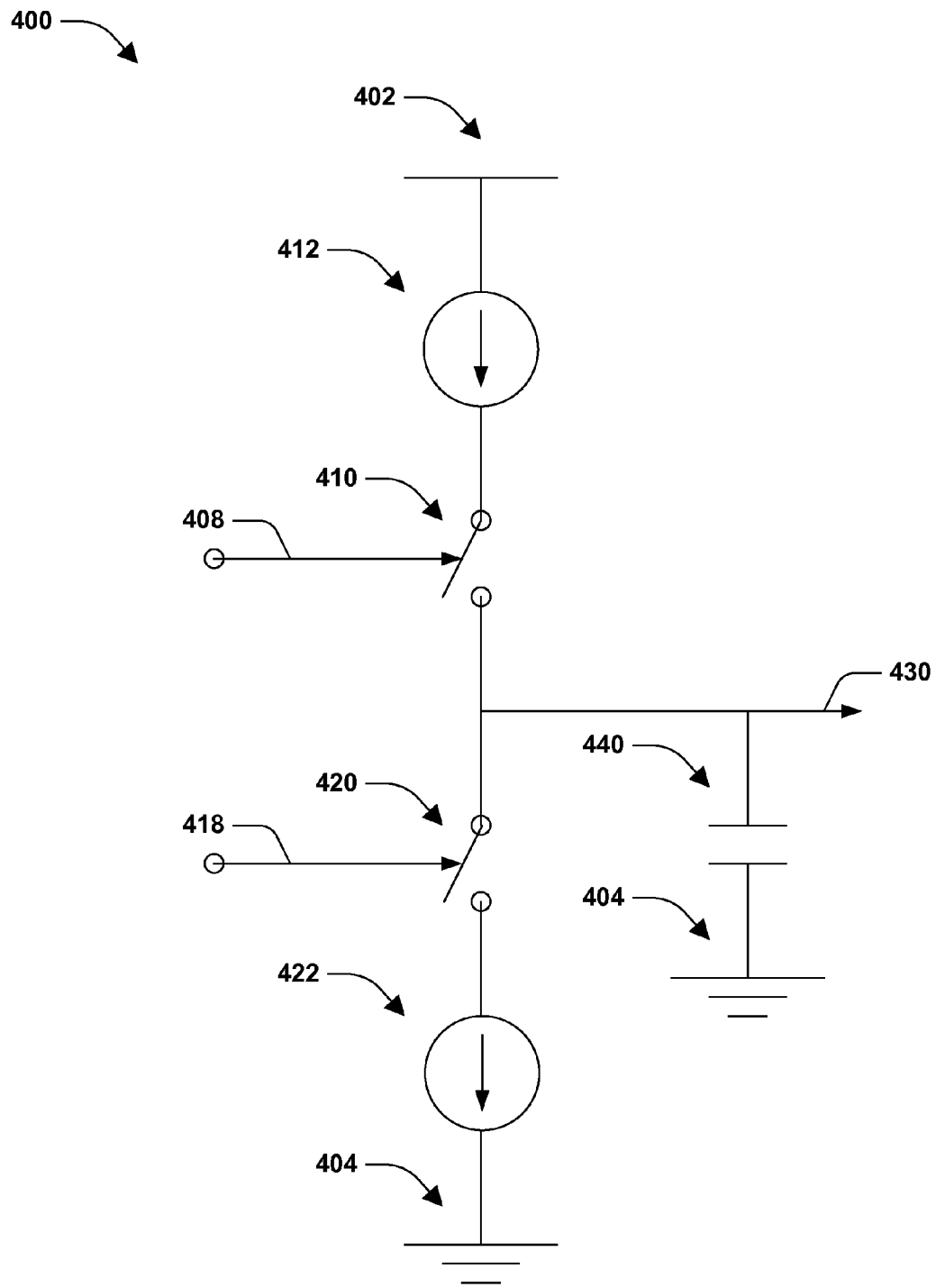
FIG. 4 is a schematic diagram of an example charge pump (CP) for a divider-less phase locked loop (PLL), according to some embodiments.

FIG. 4 is a schematic diagram of an example charge pump (CP) 400 for a divider-less phase locked loop (PLL), according to some embodiments. The example CP 400 is merely an example, and corresponds to charge pumps for other Figures, such as the first CP 210, the second CP 220, or CP 320 of FIG. 3, for example. The example CP 400 is configured to receive an up signal 408 and a down signal 418. In some embodiments, the CP 400 is configured to generate output CP signal 430. Accordingly, up signal 408, down signal 418, and output CP signal 430 correspond to at least one of an up signal for a first charge pump (CP) 112, a down signal for the first CP 114, a first portion of an output CP signal 212, an up signal for a second CP 122, a down signal for the second CP 124, or a second portion of the output CP signal 222 of FIGS. 2 and 3, respectively. Additionally, up signal 408, down signal 418, and output CP signal 430 correspond to at least one of a first error signal 312, a second error signal 314, or an output CP signal 322 of FIG. 3, respectively.

Charge pump (CP) 400 comprises a positive power supply 402 connected to a first current source 412. In some embodiments, the first current source 412 is connected to a first switch 410 configured to be controlled based on the up signal 408. Accordingly, the first switch 410 is configured to connect the first current source 410 to the output CP signal 430 and a capacitor 440 when closed. In some examples, the output CP signal 430 is connected to a second switch 420. The second switch 420 is configured to be controlled based on the down signal 418. Accordingly, the second switch 420 is configured to connect the output CP signal 430 to a second current source 422 and the capacitor 440 when closed. The second current source 422 is connected to ground 404 in some embodiments. In some embodiments, CP 400 is configured to convert a phase difference associated with the up signal 408 and the down signal 418 into an output CP signal 430. For example, the output CP signal 430 comprises a voltage indicated of the phase difference. In some embodiments, when the first switch 410 is closed for a first time period, the first current source 412 charges the capacitor 440 proportionally to the first time period at least because the first current source 412 is connected to the capacitor 440 when the first switch 410 is closed. In some embodiments, when the second switch 420 is closed for a second time period, the second current source 422 discharges the capacitor 440 proportionally to the second time period at least because the second current source 422 connects the capacitor 440 to ground 404 when the second switch 420 is closed. It will be appreciated that if the first switch 410 and the second switch 420 are both closed, output CP signal 430 is not substantially changed.

Figure 5:
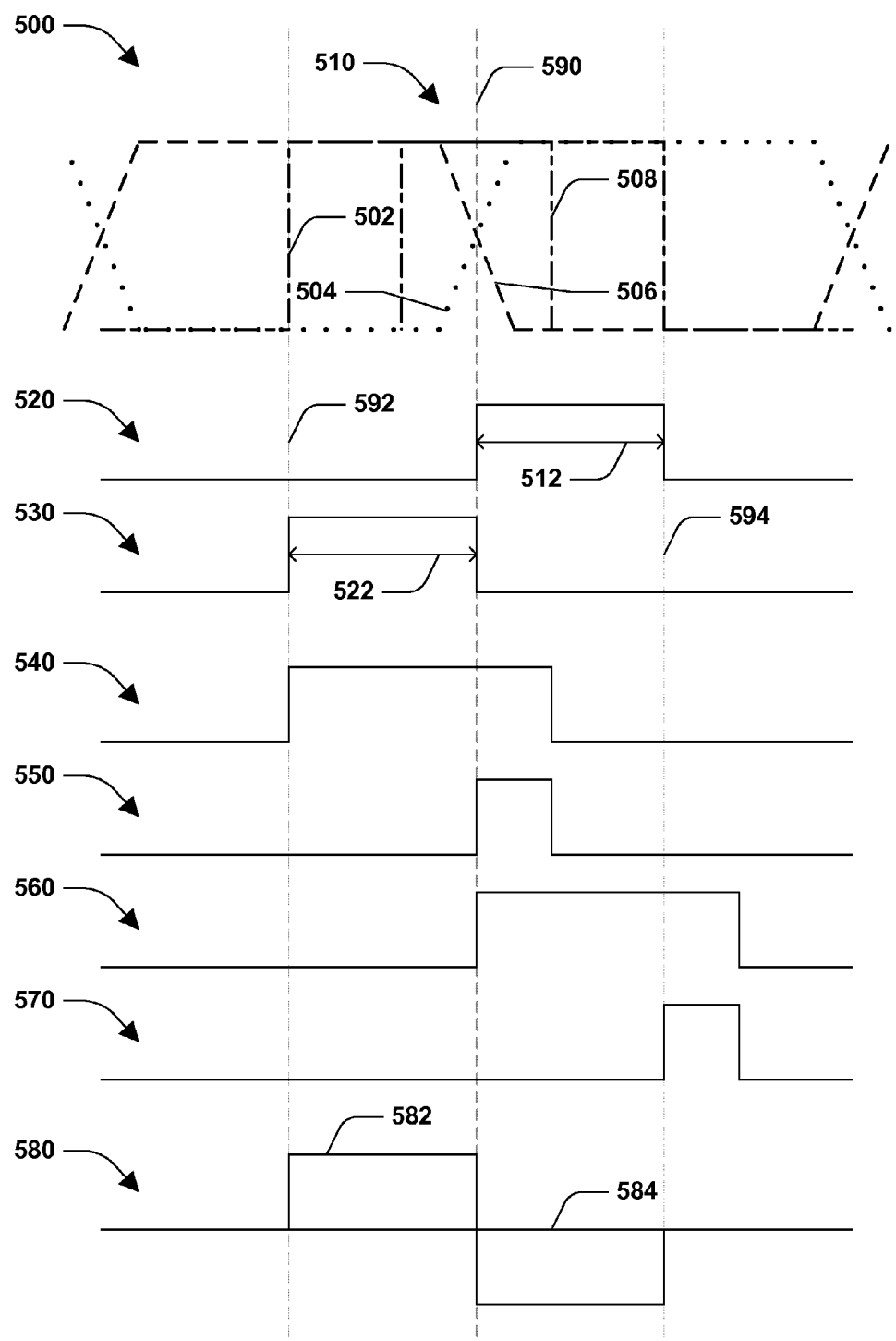
FIG. 5 is a timing diagram for an example divider-less phase locked loop (PLL), according to some embodiments.

FIG. 5 is a timing diagram 500 for an example divider-less phase locked loop (PLL), according to some embodiments. At 510, a timing diagram illustrates a pulse injection signal 508 and a pulse phase detector (pulse$_{PD}$) signal 502. In some embodiments, the pulse injection signal 508 and the pulse$_{PD}$ signal 502 are generated by a pulse generator, such as by pulse generator 230 of FIG. 3, for example. Accordingly, the pulse injection signal 508 and the pulse$_{PD}$ signal 502 of FIG. 5 correspond to the pulse injection signal 104 and the pulse$_{PD}$ signal 102 of FIG. 3. At 510, a voltage controlled oscillator positive differential (VCOP) signal 504 and a voltage controlled oscillator negative differential (VCON) signal 506 are illustrated, and correspond to the VCOP signal 182 and the VCON signal 184 of FIG. 3, in some embodiments. It will be appreciated that the VCOP signal 504 and the VCON signal 506 comprise a zero crossing at a time $t_{VCOP-VCON}$ indicated by 590, for example.

At 520, a first signal comprising a logical AND of the VCOP signal 504 and the pulse$_{PD}$ signal 502 is illustrated. In some embodiments, the PD 110 of FIG. 3 is configured to control a pulse width for the first signal based on at least one of a delay or an OR gate. A time duration $T_2$ associated with the first signal is illustrated at 512, according to some embodiments. At 530, a second signal comprising a logical AND of the VCON signal 506 and the pulse$_{PD}$ signal 502 is illustrated. For example, the PD 110 of FIG. 3 is configured to generate at least one of the first signal comprising the logical AND of the VCOP signal 504 and the pulse$_{PD}$ signal 502 or the second signal comprising the logical AND of the VCON signal 506 and the pulse$_{PD}$ signal 502. A time duration $T_1$ associated with the second signal is illustrated at 522, according to some embodiments. Generally, $t_{VCOP-VCON}$ 590 is a timing of the zero crossing, $x_1$ 592 is a timing of a rising edge of the pulse$_{PD}$ signal 502, and $x_2$ 594 is a timing of a falling edge of the pulse$_{PD}$ signal 502. Therefore, $T_1$ 522=a time duration of pulse$_{PD}$ 502 logically AND with VCON 506. Additionally, $T_1$ 522=$t_{VCOP-VCON}$ 590−$x_1$ 592. Similarly, $T_2$ 512=a time duration of pulse$_{PD}$ 502 logically AND with VCOP 504. Additionally, $T_2$ 512=$x_2$ 594−$t_{VCOP-VCON}$ 590. In some embodiments, the time duration of the first signal $T_1$ 522 is equal to the time duration of the second signal $T_2$ 512. In other embodiments, $T_1$<$T_2$ or $T_1$>$T_2$, for example. It will be appreciated that the time duration of the first signal $T_1$ 522 and the time duration of the second signal $T_2$ 512 correspond to a net charge of a first CP and a net charge of a second CP, such as the first CP 210 and the second CP 220 of FIG. 3, as discussed in FIG. 2, for example. Accordingly, a change in the net charge of a charge pump changes a phase of a corresponding output, and thus a change in a corresponding feedback signal. For example, the net charge of the first CP is $Q_1$=($t_{VCOP-VCON}$−$x_1$ 592)*$I_{CP1}$, where $I_{CP1}$ is the current of the first CP. Similarly, the net charge of the second CP is $Q_2$=($x_2$ 594−$t_{VCOP-VCON}$)*$I_{CP2}$, where $I_{CP2}$ is the current of the second CP. To make the zero crossing in the middle of the pulse such that $T_1$ 522=$T_2$ 512, $I_{CP1}$ is set substantially equal to $I_{CP2}$. However, in other embodiments, it is desirable to have $T_1$<$T_2$ or $T_2$>$T_1$, while maintaining equal charges in the first CP and the second CP such that $Q_1$=$Q_2$. In some embodiments, $I_{CP1}$ is smaller than $I_{CP2}$ to enable $T_1$>$T_2$. In other words, control signals SW1 and SW2 (not shown) are used to change the values of $I_{CP1}$ and $I_{CP2}$ to make the zero crossing of VCOP and VCON not in the middle of the injection pulse signal in some embodiments. In some embodiments, when such phase shifts occur, injection efficiency is adjusted based on the phase shift.

In some embodiments, the PD 110 of FIG. 3 is configured to control at least one of a net charge of the first CP 210, a net charge of the second CP 220, or a charge ratio between the first CP 210 and the second CP 220. In some embodiments, the PD 110 is configured to adjust as phase of a zero crossing for the VCOP signal 182 and the VCON signal 184 relative to the pulse$_{PD}$ signal 102 by generating the charge pump signals 112, 114, 122, and 124 of FIG. 3 accordingly. Therefore, an adjustment to a net charge of a charge pump changes $T_1$, $T_2$, and a pulse injection phase, for example.

At 540, an example up signal for a first CP is illustrated, such as the up signal for the first CP 112 of FIG. 3. In some embodiments, a rising edge at 592 for the up signal for the first CP 540 is generated based on a rising edge of the pulse$_{PD}$ signal 502 at 592.

At 550, an example down signal for the first CP is illustrated, such as the down signal for the first CP 114 of FIG. 3. In some embodiments, a rising edge at 590 for the down signal for the first CP 550 is generated based on a rising edge of the VCOP signal 504 at 590.

In some embodiments, a falling edge for at least one of the up signal for the first CP 540 or the down signal for the first CP 550 is generated based on a logic high up signal for the first CP 550 and a logic high down signal for the first CP 540.

At 560, an example down signal for the second CP is illustrated, such as the down signal for the second CP 124 of FIG. 3. In some embodiments, a rising edge at 590 for the down signal for the second CP 560 is generated based on a falling edge of the VCON signal 506 at 590.

At 570, an example up signal for a second CP is illustrated, such as the up signal for the second CP 122 of FIG. 3. In some embodiments, a rising edge at 594 for the up signal for the first CP 570 is generated based on a falling edge of the pulse$_{PD}$ signal 502 at 594.

In some embodiments, a falling edge for at least one of the up signal for the second CP 570 or the down signal for the second CP 560 is generated based on a logic high up signal for the second CP 570 and a logic high down signal for the second CP 560.

At 580, a first net charge of a first CP is illustrated at 582 and a net charge of a second CP is illustrated at 584. In some embodiments, the first net charge 582 is associated with at least one of the up signal for the first CP 540 and the down signal for the first CP 550. In some embodiments, the second net charge 584 is associated with at least one of the up signal for the second CP 570 and the down signal for the second CP 560.

Figure 6:
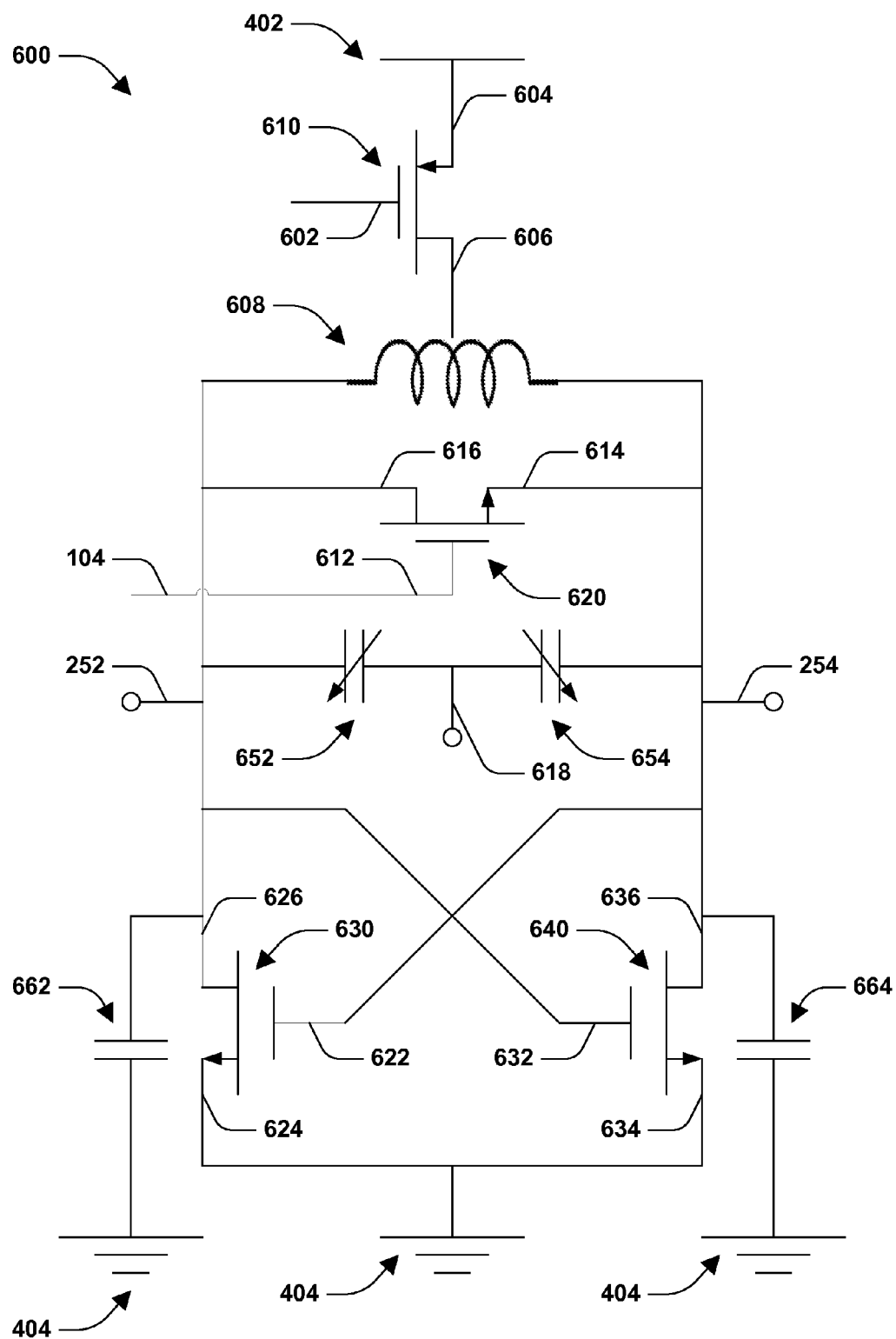
FIG. 6 is a schematic diagram of an example voltage controlled oscillator (VCO) for a divider-less phase locked loop (PLL), according to some embodiments.

FIG. 6 is a schematic diagram 600 of an example voltage controlled oscillator (VCO) for a divider-less phase locked loop (PLL), according to some embodiments, such as a zero crossing centered on a pulse$_{PD}$ signal. In some embodiments, an injection metal oxide semiconductor (MOS) transistor 620 is connected between the VCON signal 254 and the VCOP signal 252. In some embodiments, the VCO of FIG. 6 corresponds to the VCO 250 of FIG. 2 or FIG. 3. In some embodiments, the VCO 600 of FIG. 6 comprises a first transistor 610, a second transistor 620, a third transistor 630, a fourth transistor 640, and an inductor 608. In some embodiments, at least one of the transistors 610, 620, 630, or 640 is a metal oxide semiconductor (MOS) transistor. In some embodiments, a gate of the first transistor is 602, a source of the first transistor 604 is connected to a positive supply voltage 402, and a drain of the first transistor 606 is connected to the inductor 608. The inductor 608 is connected to a source of the second transistor 614 and a drain of the second transistor 616. A gate of the second transistor 612 is connected to a pulse injection signal, such as the pulse injection signal 104 of FIG. 3, for example. In some embodiments, VCOP 252 and VCON 254 are connected to the drain of the second transistor 616 and the source of the second transistor 614, respectively. In some embodiments, VCOP 252 and VCON 254 are connected to a first variable capacitor 652 and a second variable capacitor 654. At 618, a voltage control node is connected between the first variable capacitor 652 and the second variable capacitor 654. In some embodiments, VCOP 252 and VCON 254 are connected to a gate of the fourth transistor 632 and a gate of the third transistor 622, respectively. In some embodiments, VCOP 252 and VCON 254 are connected to a drain of the third transistor 626 and a drain of the fourth transistor 636, respectively. In some embodiments, the drain of the third transistor 626 and the drain of the fourth transistor 636 are connected to a first capacitor 662 and a second capacitor 664 and then to ground 404, respectively. In some embodiments, the source of the third transistor 624 and the source of the fourth transistor 634 are connected to ground 404.

Figure 7:
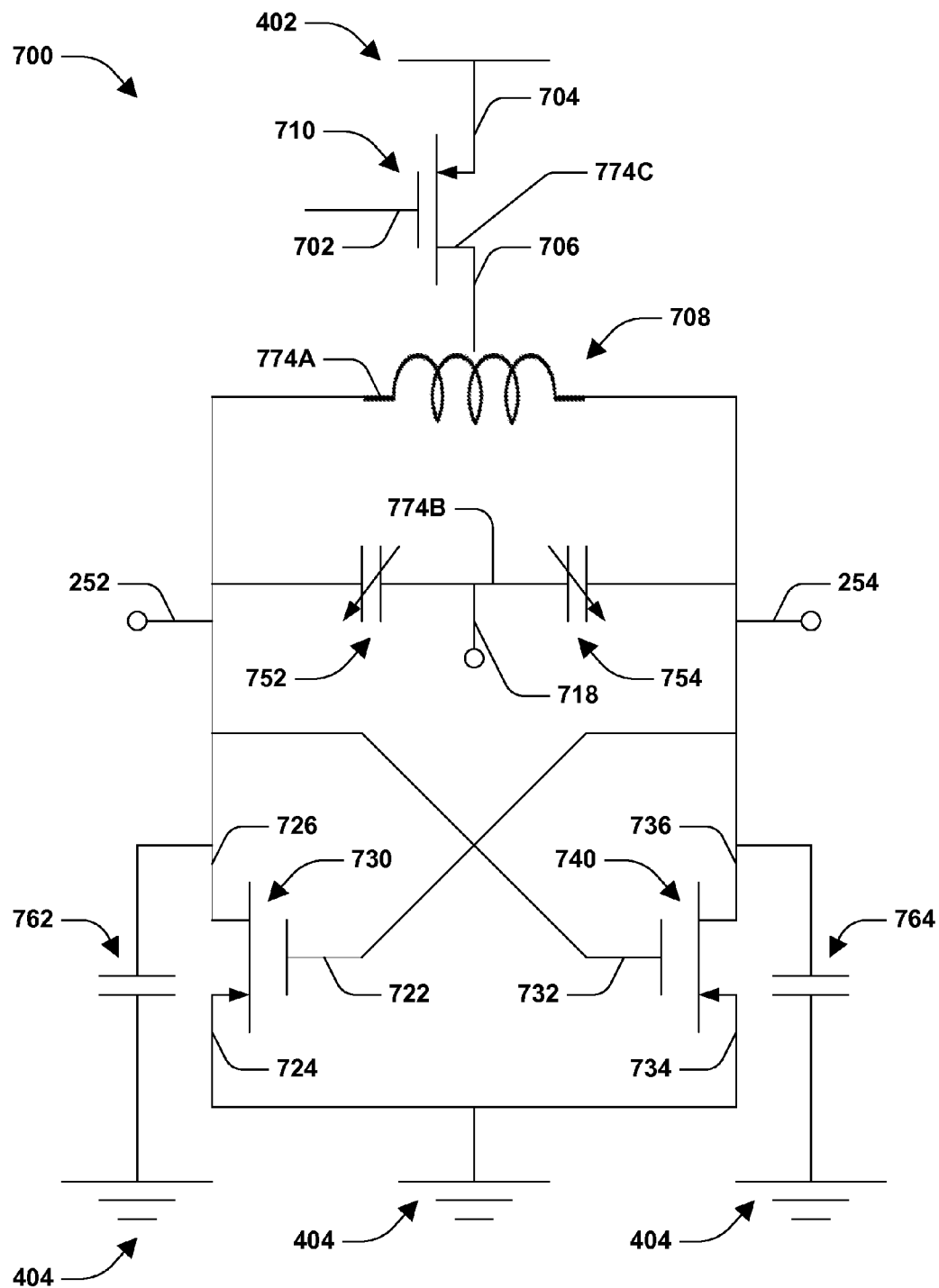
FIG. 7 is a schematic diagram of an example voltage controlled oscillator (VCO) for a divider-less phase locked loop (PLL), according to some embodiments.

FIG. 7 is a schematic diagram 700 of an example voltage controlled oscillator (VCO) for a divider-less phase locked loop (PLL), according to some embodiments. In some embodiments, the VCO of FIG. 7 corresponds to the VCO 250 of FIG. 2 or FIG. 3. In some embodiments, the VCO 700 of FIG. 7 comprises a first transistor 710, a third transistor 730, a fourth transistor 740, and an inductor 708. In some embodiments, at least one of the transistors 710, 720, 730, or 740 is a metal oxide semiconductor (MOS) transistor. In some embodiments, a gate of the first transistor is 702, a source of the first transistor 704 is connected to a positive supply voltage 402, and a drain of the first transistor 706 is connected to the inductor 708. The inductor 708 is connected to VCOP 252 and VCON 254. At 774A, a center tap of the inductor 708 is connected to a pulse injection signal, such as the pulse injection signal 104 of FIG. 3, for example. Similarly, at 774B, a voltage control node 718 is connected to the pulse injection signal, such as the pulse injection signal 104 of FIG. 3, for example. Additionally, at 774C, a body of the first transistor 706 is connected to the pulse injection signal 104 of FIG. 3. In some embodiments, VCOP 252 and VCON 254 are connected to a first variable capacitor 752 and a second variable capacitor 754. At 718, the voltage control node is connected between the first variable capacitor 752 and the second variable capacitor 754. In some embodiments, VCOP 252 and VCON 254 are connected to a gate of the fourth transistor 732 and a gate of the third transistor 722, respectively. In some embodiments, VCOP 252 and VCON 254 are connected to a drain of the third transistor 726 and a drain of the fourth transistor 736, respectively. In some embodiments, the drain of the third transistor 726 and the drain of the fourth transistor 736 are connected to a first capacitor 762 and a second capacitor 764 and then to ground 404, respectively. In some embodiments, the source of the third transistor 724 and the source of the fourth transistor 734 are connected to ground 404.

Figure 8:
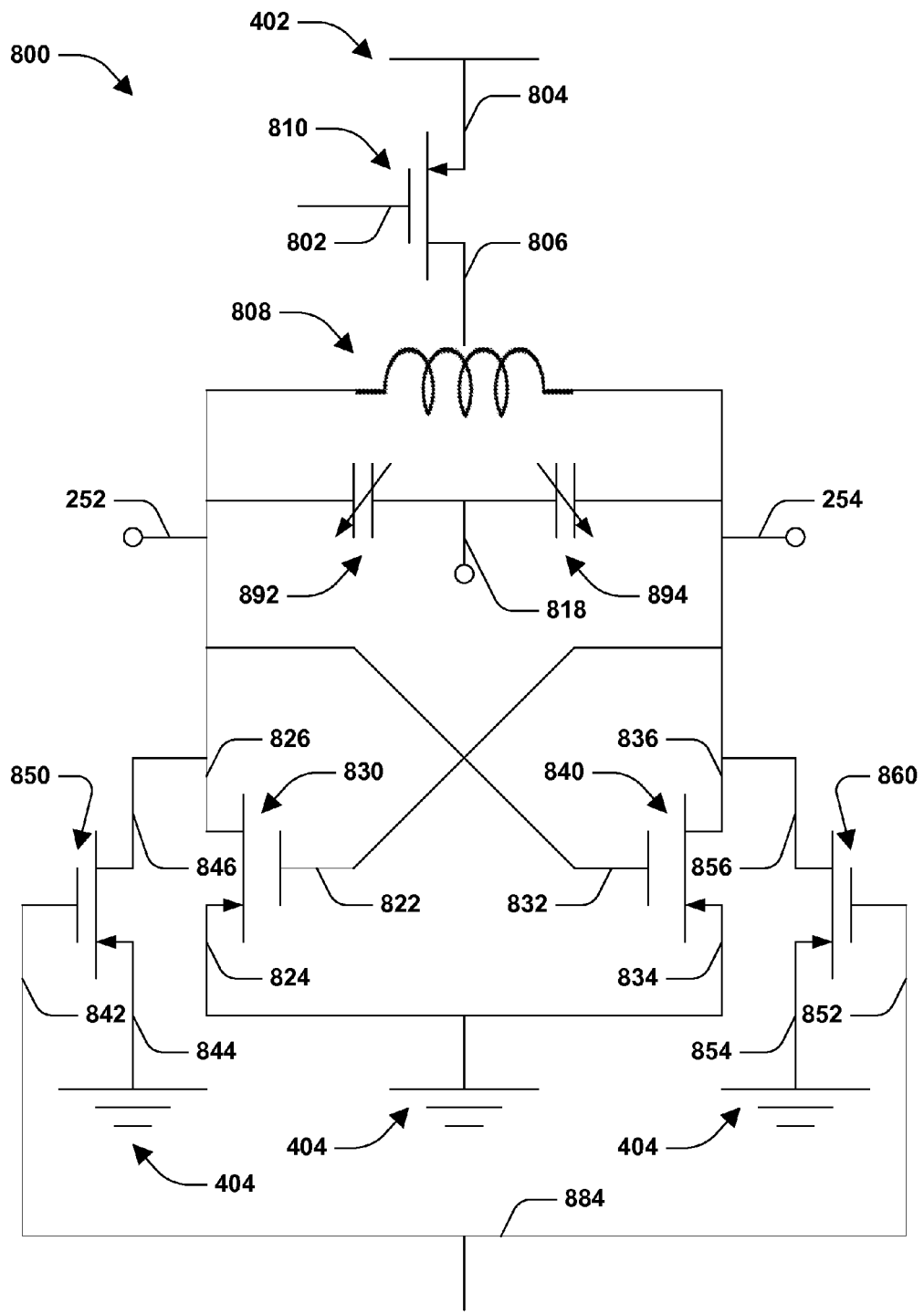
FIG. 8 is a schematic diagram of an example voltage controlled oscillator (VCO) for a divider-less phase locked loop (PLL), according to some embodiments.

FIG. 8 is a schematic diagram 800 of an example voltage controlled oscillator (VCO) for a divider-less phase locked loop (PLL), according to some embodiments. In some embodiments, the VCO of FIG. 8 corresponds to the VCO 250 of FIG. 2 or FIG. 3. In some embodiments, the VCO 800 of FIG. 8 comprises a first transistor 810, a third transistor 830, a fourth transistor 840, a fifth transistor 850, a sixth transistor 860, and an inductor 808. In some embodiments, at least one of the transistors 810, 830, 840, 850, or 860 is a metal oxide semiconductor (MOS) transistor. In some embodiments, a gate of the first transistor is 802, a source of the first transistor 804 is connected to a positive supply voltage 402, and a drain of the first transistor 806 is connected to the inductor 808. The inductor 808 is connected to VCOP 252 and VCON 254. In some embodiments, VCOP 252 and VCON 254 are connected to a first variable capacitor 892 and a second variable capacitor 894. At 818, a voltage control node is connected between the first variable capacitor 892 and the second variable capacitor 894. In some embodiments, VCOP 252 and VCON 254 are connected to a gate of the fourth transistor 832 and a gate of the third transistor 822, respectively. In some embodiments, VCOP 252 and VCON 254 are connected to a drain of the third transistor 826 and a drain of the fourth transistor 836, respectively. In some embodiments, the drain of the third transistor 826 and the drain of the fourth transistor 836 are connected to a drain of the fifth transistor 846 and a drain of the sixth transistor 856. In some embodiments, the source of the third transistor 824, the source of the fourth transistor 834, the source of the fifth transistor 844, and the source of the sixth transistor 854 are connected to ground 404. In some embodiments, a gate of the fifth transistor 842 and a gate of the sixth transistor 852 are connected to a pulse injection signal, such as the pulse injection signal 104 of FIG. 3, for example.

It will be appreciated that in some embodiments described herein, a transistor of an AND gate, such as a metal oxide semiconductor (MOS) transistor, is replaced by a load resistor to increase an operating frequency of the AND gate, for example. In this way load resistors in an AND gate enable an increase in bandwidth and a reduction in power consumption for high frequency operation. In other embodiments, OR gates or delays are implemented to adjust a width of an associated pulse, such as a pulse of a logical AND of a $pulse_{PD}$ signal 102 and a VCOP signal 182 of FIG. 3, for example.

Figure 9:
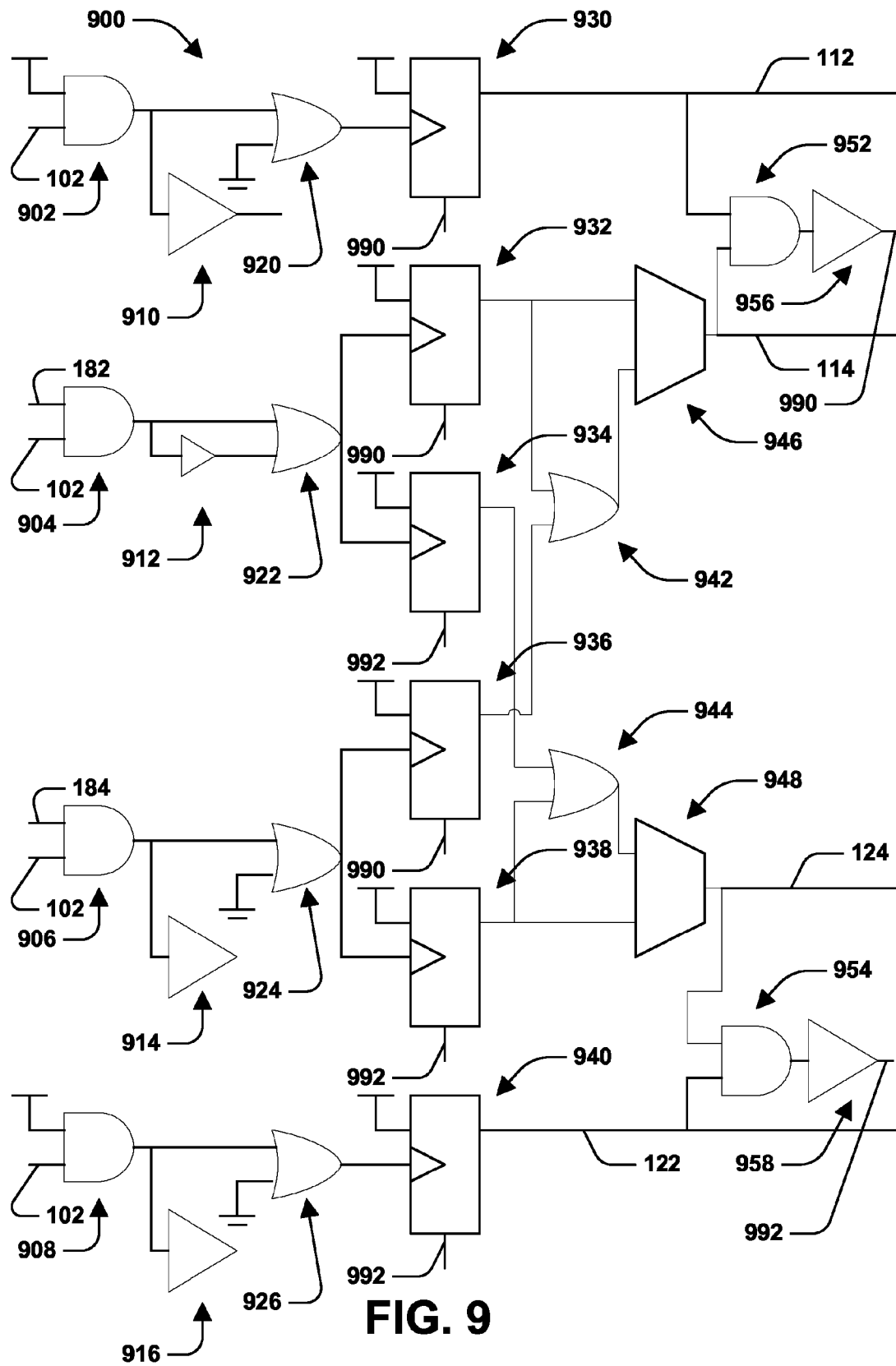
FIG. 9 is a schematic diagram of an example phase detector (PD) for a divider-less phase locked loop (PLL), according to some embodiments.

FIG. 9 is a schematic diagram 900 of an example phase detector (PD) for a divider-less phase locked loop (PLL), according to some embodiments. In some embodiments, the PD of FIG. 9 corresponds to the PD 110 of FIG. 2 or FIG. 3. In some embodiments, the PD 900 of FIG. 9 comprises a first AND gate 902, a second AND gate 904, a third AND gate 906, and a fourth AND gate 908. Additionally, the PD 900 comprises a first inverter 910, a second inverter 912, a third inverter 914, and a fourth inverter 916. In some embodiments, the PD 900 comprises a first OR gate 920, a second OR gate 922, a third OR gate 924, and a fourth OR gate 926. In some embodiments, the PD 900 comprises a first, second, third, fourth, fifth, and sixth D flip flop 930, 932, 934, 936, 938, and 940. In some embodiments, the PD 900 comprises a fifth OR gate 942 and a sixth OR gate 944. Additionally, the PD 900 comprises a first multiplexer 946, a second multiplexer 948, a fifth AND gate 952, a sixth AND gate 954, a fifth inverter 956, and a sixth inverter 958.

In some embodiments, the first AND gate 902 and the fourth AND gate 908 are configured to receive a positive supply voltage. In some embodiments, the first AND gate 902, the second AND gate 904, the third AND gate 906, and the fourth AND gate 908 are configured to receive a pulse phase detector ($pulse_{PD}$) signal, such as the $pulse_{PD}$ signal 102 of FIG. 3. In some embodiments, the second AND gate 904 is configured to receive a VCOP signal, such as the VCOP signal 182 of FIG. 3. In some embodiments, the third AND gate 906 is configured to receive a VCON signal, such as the VCON signal 184 of FIG. 3. In some embodiments, the first inverter 910, the second inverter 912, the third inverter 914, and the fourth inverter 916 are configured to receive an output of the first AND gate 902, the second AND gate 904, the third AND gate 906, and the fourth AND gate 908, respectively. In some embodiments, first OR gate 920, the second OR gate 922, the third OR gate 924, and the fourth OR gate 926 are configured to receive an output of the first AND gate 902, the second AND gate 904, the third AND gate 906, and the fourth AND gate 908, respectively. In some embodiments, first OR gate 920, the third OR gate 924, and the fourth OR gate 926 are configured to receive a connection to ground. In some embodiments, the second OR gate 922 is configured to receive an output of the second inverter 912. In some embodiments, the first D flip flop 930 is configured to receive an output from the first OR gate 920, the second D flip flop 932 is configured to receive an output from the second OR gate 922, the third D flip flop 934 is configured to receive an output from the second OR gate 922, the fourth D flip flop 936 is configured to receive an output from the third OR gate 924, the fifth D flip flop 938 is configured to receive an output from the third OR gate 924, and the sixth D flip flop 940 is configured to receive an output from the fourth OR gate 926. In some embodiments, the fifth OR gate 942 is configured to receive an output from the second D flip flop 932 and the fourth D flip flop 936. In some embodiments, the sixth OR gate 944 is configured to receive an output from the third D flip flop 934 and the fifth D flip flop 938. In some embodiments, the first multiplexer 946 is configured to receive an output from the second D flip flop 932 and the fifth OR gate 942. In some embodiments, the second multiplexer 948 is configured to receive an output from the sixth OR gate 944 and the fifth D flip flop 938. In some embodiments, the fifth AND gate 952 is configured to receive an output from the first D flip flop 930 and the first multiplexer 946. In some embodiments, the sixth AND gate 954 is configured to receive an output from the second multiplexer 948 and the sixth D flip flop 940. In some embodiments, the fifth inverter 956 and the sixth inverter 958 are configured to receive outputs from the fifth AND gate 952 and the sixth AND gate 954, respectively. In some embodiments, the up signal for the first CP 112 is the output of the first D flip flop 930. In some embodiments, the up signal for the first CP 112 is the output of the first D flip flop 930. In some embodiments, the up signal for the second CP 122 is the output of the sixth D flip flop 940. In some embodiments, the down signal for the first CP 114 is the output of the first multiplexer 946. In some embodiments, the down signal for the second CP 124 is the output of the second multiplexer 948. In some embodiments, 990 indicates res1 and 992 indicates res2. In some embodiments, res1 is a first reset signal and res2 is a second reset signal. For example, res1 is used to reset D flip flops 930, 932, and 936. Similarly, res2 is used to reset D flip flops 934, 938, and 940, for example.

In some embodiments, the phase detector (PD) 900 of FIG. 9 is configured to generate a rising edge for the up signal for the first CP 112 based on a rising edge of the pulse$_{PD}$ signal 102, a rising edge for the up signal for the second CP 122 based on a falling edge of the pulse$_{PD}$ signal 102, a rising edge for the down signal for the first CP 114 based on a rising edge of the VCOP signal 182, a rising edge for the down signal for the second CP 124 based on a falling edge of the VCON signal 184, a falling edge for at least one of the up signal for the first CP 112 or the down signal for the first CP 114 based on a logic high up signal for the first CP 112 and a logic high down signal for the first CP 114 or a rising edge of a first reset signal, such as res1 990, or a falling edge for at least one of the up signal for the second CP 122 or the down signal for the second CP 124 based on a logic high up signal for the second CP 122 and a logic high down signal for the second CP 124 or a rising edge of a second reset signal, such as res2 992. It will be appreciated that in some embodiments, the up signal for the first CP 112 is a first up signal 112, the down signal for the first CP 114 is a first down signal 114, the up signal for the second CP 122 is a second up signal 122, and the down signal for the second CP 124 is a second down signal 124.

Figure 10:
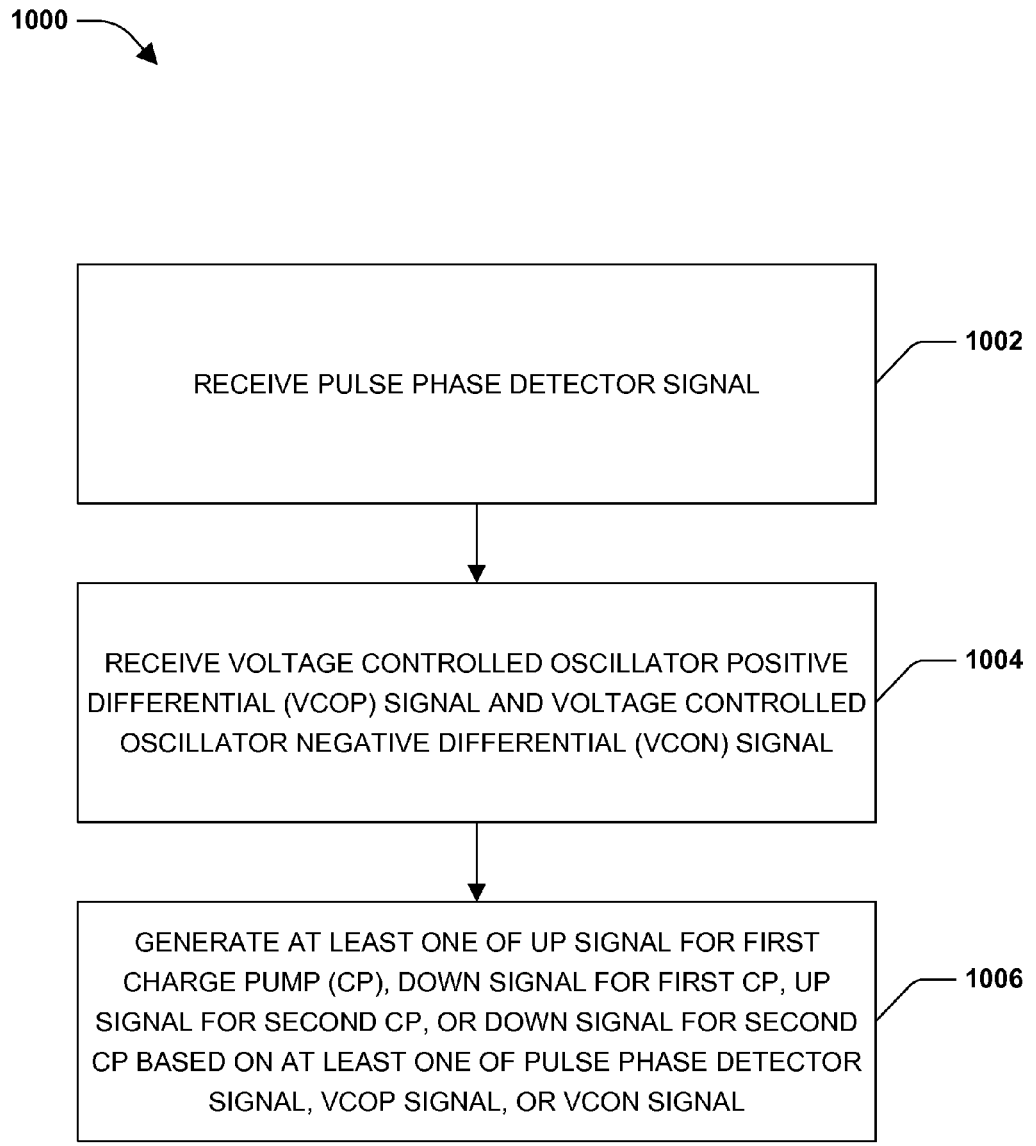
FIG. 10 is a flow diagram of an example method for phase detection within a divider-less phase locked loop (PLL), according to some embodiments.

FIG. 10 is a flow diagram of an example method 1000 for phase detection within a divider-less phase locked loop (PLL), according to some embodiments. At 1002, a pulse phase detector (pulse$_{PD}$) signal associated with a reference frequency is received. At 1004, a voltage controlled oscillator positive differential (VCOP) signal and voltage controlled oscillator negative differential (VCON) signal are received, at least one of VCOP signal or VCON signal associated with output frequency of voltage controlled oscillator (VCO), output frequency of VCO comprising integer multiple of reference frequency. At 1006, at least one of up signal for first charge pump (CP), down signal for first CP, up signal for second CP, or down signal for second CP is generated based on at least one of pulse phase detector signal, VCOP signal, or VCON signal, at least one of up signal for first CP, down signal for first CP, up signal for second CP, or down signal for second CP configured to facilitate control of at least one of first CP or second CP. In some embodiments, the method 1000 comprises generating at least one of a first signal comprising a logical AND of the VCOP signal and the pulse$_{PD}$ signal or a second signal comprising a logical AND of the VCON signal and the pulse$_{PD}$ signal.

According to an aspect, a method for phase detection within a divider-less phase locked loop (PLL) is provided, comprising receiving a pulse phase detector (pulse$_{PD}$) signal associated with a reference frequency. In some embodiments, the method comprises receiving a voltage controlled oscillator positive differential (VCOP) signal and a voltage controlled oscillator negative differential (VCON) signal. For example, at least one of the VCOP signal or the VCON signal is associated with an output frequency of a voltage controlled oscillator (VCO). Additionally, the output frequency of the VCO comprises an integer multiple of the reference frequency. In some embodiments, the method comprises generating at least one of an up signal for a first charge pump (CP), a down signal for the first CP, an up signal for a second CP, or a down signal for the second CP based on at least one of the pulse$_{PD}$ signal, the VCOP signal, or the VCON signal. For example, at least one of the up signal for the first CP, the down signal for the first CP, the up signal for the second CP, or the down signal for the second CP is configured to facilitate control of at least one of the first CP or the second CP.

According to an aspect, a phase detector (PD) for a divider-less phase locked loop (PLL) is provided and configured to receive a pulse phase detector (pulse$_{PD}$) signal associated with a reference frequency. In some embodiments, the PD is configured to receive a voltage controlled oscillator positive differential (VCOP) signal and a voltage controlled oscillator negative differential (VCON) signal. For example, at least one of the VCOP signal or the VCON signal associated with an output frequency of a voltage controlled oscillator (VCO), the output frequency of the VCO comprising an integer multiple of the reference frequency. In some embodiments, the PD is configured to generate at least one of an up signal for a first charge pump (CP), a down signal for the first CP, an up signal for a second CP, or a down signal for the second CP based on at least one of the pulse$_{PD}$ signal, the VCOP signal, or the VCON signal. For example, at least one of the up signal for the first CP, the down signal for the first CP, the up signal for the second CP, or the down signal for the second CP is configured to adjust a zero crossing phase of the VCON signal and the VCOP signal with respect to the $pulse_{PD}$ signal, thus enabling the PLL to be divider-less and consume less power.

According to an aspect, a divider-less phase locked loop (PLL) is provided, comprising a pulse generator configured to generate at least one of a pulse injection signal or a pulse phase detector ($pulse_{PD}$) signal based on a reference frequency. In some embodiments, the PLL comprises a phase detector (PD) configured to generate at least one of a first up signal, a first down signal, a second up signal, or a second down signal based on at least one of the $pulse_{PD}$ signal, a voltage controlled oscillator positive differential (VCOP) signal, or a voltage controlled oscillator negative differential (VCON) signal. In some embodiments, the PLL comprises a first charge pump (CP) configured to generate a first portion of an output CP signal based on at least one of the first up signal or the first down signal. Additionally, the PLL comprises a second CP configured to generate a second portion of the output CP signal based on at least one of the second up signal or the second down signal. Some embodiments comprise a loop filter configured to filter the output CP signal and a voltage controlled oscillator (VCO) configured to generate at least one of the VCOP signal or the VCON signal based on at least one of the filtered output CP signal or the pulse injection signal. For example, at least one of the VCOP signal or the VCON signal associated with an output frequency of the VCO.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for phase detection within a divider-less phase locked loop (PLL), comprising:

receiving a pulse phase detector ($pulse_{PD}$) signal associated with a reference frequency;

receiving a voltage controlled oscillator positive differential (VCOP) signal and a voltage controlled oscillator negative differential (VCON) signal, the VCOP signal and the VCON signal corresponding to a differential pair associated with an output frequency of a voltage controlled oscillator (VCO);

generating a first up signal and a first down signal for a first charge pump (CP), at least one of the first up signal or the first down signal based on the $pulse_{PD}$ signal and at least one the first up signal or the first down signal based on the VCOP signal; and generating a second up signal and a second down signal for a second CP, at least one of the second up signal or the second down signal based on the $pulse_{PD}$ signal and at least one of the second up signal or the second down signal based on the VCON signal.

2. The method of claim 1, comprising generating at least one of the first up signal, the first down signal, the second up signal, or the second down signal such that a zero crossing of the VCON signal and the VCOP signal is substantially centered with respect to the $pulse_{PD}$ signal.

3. The method of claim 1, comprising generating at least one of the first up signal, the first down signal, the second up signal, or the second down signal such that a phase difference between the $pulse_{PD}$ signal and a zero crossing of the VCON signal and the VCOP signal is zero.

4. The method of claim 1, comprising disconnecting a divider from at least one of the VCON signal or VCOP signal in response to a lock in a phase locked loop (PLL).

5. The method of claim 1, comprising enabling a pulse injection associated with the VCO in response to an adjustment to a zero crossing phase of the VCON signal and the VCOP signal.

6. The method of claim 1, comprising generating at least one of:

a first signal comprising a logical AND of the VCOP signal and the $pulse_{PD}$ signal; or a second signal comprising a logical AND of the VCON signal and the $pulse_{PD}$ signal.

7. The method of claim 6, comprising controlling a pulse width for the first signal based on at least one of a delay or an OR gate.

8. The method of claim 1, at least one of:

the generating a first up signal comprising generating a rising edge of the first up signal based on a rising edge of the $pulse_{PD}$ signal; or the generating a second up signal comprising generating a rising edge of the second up signal based on a falling edge of the $pulse_{PD}$ signal.

9. The method of claim 1, at least one of:

the generating a first down signal comprising generating a rising edge of the first down signal based on a rising edge of the VCOP signal; or the generating a second down signal comprising generating a rising edge of the second down signal based on a falling edge of the VCON signal.

10. A phase detector (PD) for a divider-less phase locked loop (PLL), configured to:

receive a pulse phase detector ($pulse_{PD}$) signal associated with a reference frequency;

receive a voltage controlled oscillator positive differential (VCOP) signal and a voltage controlled oscillator negative differential (VCON) signal, at least one of the VCOP signal or the VCON signal associated with an output frequency of a voltage controlled oscillator (VCO), the output frequency of the VCO comprising an integer multiple of the reference frequency; and
generate at least one of a first up signal for a first charge pump (CP), a first down signal for the first CP, a second up signal for a second CP, or a second down signal for the second CP based on at least one of the pulse$_{PD}$ signal, the VCOP signal, or the VCON signal, at least one of the first up signal, the first down signal, the second up signal, or the second down signal configured to adjust a zero crossing phase of the VCON signal and the VCOP signal with respect to the pulse$_{PD}$ signal.

11. The phase detector (PD) of claim 10, configured to generate at least one of:
a first signal comprising a logical AND of the VCOP signal and the pulse$_{PD}$ signal; or
a second signal comprising a logical AND of the VCON signal and the pulse$_{PD}$ signal.

12. The phase detector (PD) of claim 11, configured to control a pulse width for the first signal based on at least one of a delay or an OR gate.

13. The phase detector (PD) of claim 10, configured to generate at least one of:
a rising edge of the first up signal based on a rising edge of the pulse$_{PD}$ signal; or
a rising edge of the second up signal based on a falling edge of the pulse$_{PD}$ signal.

14. The phase detector (PD) of claim 10, configured to generate at least one of:
a rising edge of the first down signal based on a rising edge of the VCOP signal; or
a rising edge of the second down signal based on a falling edge of the VCON signal.

15. A divider-less phase locked loop (PLL), comprising:
a pulse generator configured to generate a pulse phase detector (pulse$_{PD}$) signal based on a reference frequency;
a phase detector (PD) configured to:
generate a first up signal and a first down signal, at least one of the first up signal or the first down signal generated based on a voltage controlled oscillator positive differential (VCOP) signal, and
generate a second up signal and a second down signal, at least one of second up signal or the second down signal generated based on a voltage controlled oscillator negative differential (VCON) signal;
a first charge pump (CP) configured to generate a first portion of an output CP signal based on at least one of the first up signal or the first down signal;
a second CP configured to generate a second portion of the output CP signal based on at least one of the second up signal or the second down signal;
a voltage controlled oscillator (VCO) configured to generate the VCOP signal and the VCON signal based on output CP signal.

16. The divider-less phase locked loop (PLL) of claim 15, at least one of the PD, the first CP, or the second CP configured to control a charge ratio between the first CP and the second CP.

17. The divider-less phase locked loop (PLL) of claim 15, at least one of the PD, the first CP, or the second CP configured to adjust a zero crossing phase of the VCON signal and the VCOP signal with respect to the pulse$_{PD}$ signal.

18. The divider-less phase locked loop (PLL) of claim 15, the pulse generator configured to inject a pulse injection signal into the VCO based on a phase difference between the pulse$_{PD}$ signal and a zero crossing of the VCON signal and the VCOP signal.

19. The method of claim 1, the generating a first down signal comprising generating an edge of the first down signal based on an edge of the VCOP signal.

20. The method of claim 1, the first up signal different than the second up signal.

* * * * *